United States Patent
Chang et al.

(10) Patent No.: US 11,387,781 B1
(45) Date of Patent: Jul. 12, 2022

(54) FAST START-UP CRYSTAL OSCILLATOR AND FAST START-UP METHOD THEREOF

(71) Applicant: MEDIATEK INC., Hsin-Chu (TW)

(72) Inventors: Keng-Meng Chang, Hsinchu (TW); Yao-Chi Wang, Hsinchu (TW); Yanjie Mo, Sichuan (CN); Sen-You Liu, Hsinchu (TW); Chun-Ming Lin, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/395,439

(22) Filed: Aug. 5, 2021

(30) Foreign Application Priority Data

Jun. 21, 2021 (CN) .......................... 202110687355.2

(51) Int. Cl.
*H03B 5/32* (2006.01)
*H03K 5/00* (2006.01)
*H03B 5/36* (2006.01)
*H03B 5/12* (2006.01)
*H03L 7/00* (2006.01)
*H03L 7/06* (2006.01)

(52) U.S. Cl.
CPC ............. *H03B 5/32* (2013.01); *H03B 5/1215* (2013.01); *H03B 5/364* (2013.01); *H03B 5/366* (2013.01); *H03K 5/00006* (2013.01); *H03L 7/00* (2013.01); *H03L 7/06* (2013.01); *H03B 2200/009* (2013.01); *H03B 2200/0094* (2013.01)

(58) Field of Classification Search
CPC .. H03L 7/00; H03L 7/06; H03B 5/364; H03B 5/366; H03B 2200/009; H03B 5/1215; H03B 5/32; H03B 2200/0094; H03K 5/00006

USPC ......... 331/17, 15, 18, 158, 116 FE; 327/156, 327/147

See application file for complete search history.

(56) References Cited

U.S. PATENT DOCUMENTS 7,425,852 B2 * 9/2008 Garzarolli ................. H03L 7/10
327/147
9,246,435 B1 1/2016 Kavousian
(Continued)

OTHER PUBLICATIONS

Karim M. Megawer, Nilanjan Pal, Ahmed Elkholy, Mostafa G. Ahmed, Amr Khashaba, Danielle Griffith, Pavan Kumar Hanumolu, "A 54MHz Crystal Oscillator with 30× Start-Up Time Reduction Using 2-Step Injection in 65nm CMOS", ISSCC, 2019, IEEE, USA.

*Primary Examiner* — Arnold M Kinkead
(74) *Attorney, Agent, or Firm* — Winston Hsu (57) ABSTRACT

A fast start-up crystal oscillator (XO) and a fast start-up method thereof are provided. The fast start-up XO may include a XO core circuit, a frequency synthesizer, and a fast start-up interfacing circuit, wherein the frequency synthesizer may include a voltage control oscillator (VCO) and a divider. The XO core circuit generates a XO signal having a XO frequency. The VCO generates a VCO clock having a VCO frequency, and the divider generates a divided clock having a divided frequency, wherein the VCO frequency is divided by a divisor of the divider to obtain the divided frequency. The fast start-up interfacing circuit transmits the divided clock to the XO core circuit, and then generates a reference clock having the XO frequency according to the XO signal. More particularly, the VCO frequency is calibrated according to the reference clock, in order to make the divided frequency approach the XO frequency.

14 Claims, 11 Drawing Sheets

(56) References Cited

U.S. PATENT DOCUMENTS 10,135,390 B2 11/2018 Kumar
10,581,378 B1 3/2020 Verhoef

* cited by examiner

FAST START-UP CRYSTAL OSCILLATOR AND FAST START-UP METHOD THEREOF

BACKGROUND

The present invention is related to start-up of crystal oscillators (XOs), and more particularly, to a fast start-up XO and a fast start-up method thereof.

For future communications application (e.g., a duty-cycled wireless/wired system), when there is no data to be sent or received, a crystal oscillator (XO) within a communications device may enter a sleep mode (e.g., disable oscillation of the XO) in order to save power; and when there is data to be sent or received, the XO may enter a wakeup mode for startup of oscillation, and then enter a listen mode which has steady oscillation, allowing the communications device to normally send or receive data.

Some fast start-up methods are proposed in related arts. Some disadvantages exist in the related art, however. For example, settings related to the start-up of oscillation need to be calibrated when an electronic device is powered on. Calibration of these settings in the related art is time consuming, and is therefore not preferably to be performed when the XO enters the wakeup mode from the sleep mode every time. Thus, if these settings are fixed after power on, performance of the start-up will be sensitive to environmental factors such as temperature variation. In order to compensate the impact of temperature variation, some trimming regarding temperature-affected components within start-up circuits of the XO may be required in order to ensure the start-up performance, but overall cost such as hardware resources and measurement tasks will be greatly increased.

Thus, there is a need for a novel architecture of a fast start-up XO and a related fast start-up method, in order to ensure that performance (e.g., speed) of start-up of a XO can be less sensitive to temperature variation.

SUMMARY

In view of the above, an objective of the present invention is to provide a fast start-up crystal oscillator (XO) and a fast start-up method thereof, in order to improve robustness of a fast start-up procedure without introducing any side effect or in a way that is less likely to introduce side effects.

At least one embodiment of the present invention provides a XO. The XO may comprise a XO core circuit, a frequency synthesizer, and an interfacing circuit coupled between the XO core circuit and the frequency synthesizer, wherein the frequency synthesizer may comprise a voltage control oscillator (VCO) and a divider coupled to the VCO. The XO core circuit is configured to generate a XO signal having a XO frequency. The VCO is configured to generate a VCO clock having a VCO frequency, and the divider is configured to generate a divided clock having a divided frequency, wherein the VCO frequency is divided by a divisor of the divider to obtain the divided frequency. The interfacing circuit is configured to transmit the divided clock to the XO core circuit, and then generate a reference clock having the XO frequency according to the XO signal. More particularly, the VCO frequency is calibrated according to the reference clock.

At least one embodiment of the present invention provides a start-up method of a XO. The start-up method may comprise: utilizing a VCO to generate a VCO clock having a VCO frequency; utilizing a divider to generate a divided clock having a divided frequency, wherein the VCO frequency is divided by a divisor of the divider to obtain the divided frequency; and utilizing an interfacing circuit to transmit the divided clock to a XO core circuit; utilizing the XO core circuit to generate a XO signal having a XO frequency with aid of the divided clock; and utilizing the interfacing circuit to generate a reference clock having the XO frequency according to the XO signal, wherein the VCO frequency is calibrated according to the reference clock.

The XO and the start-up method provided by the embodiments of the present invention can calibrate the frequency of the signal injected into the XO core circuit under a higher operating frequency (e.g., the frequency of the VCO clock), thereby greatly shorten the required time for calibration. In addition, as a VCO within current transceivers usually operates under a frequency over Giga Hertz (GHz) level, which is possible to be implemented by an inductor-capacitor (LC) oscillator, thereby further reducing sensitivity to temperature.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
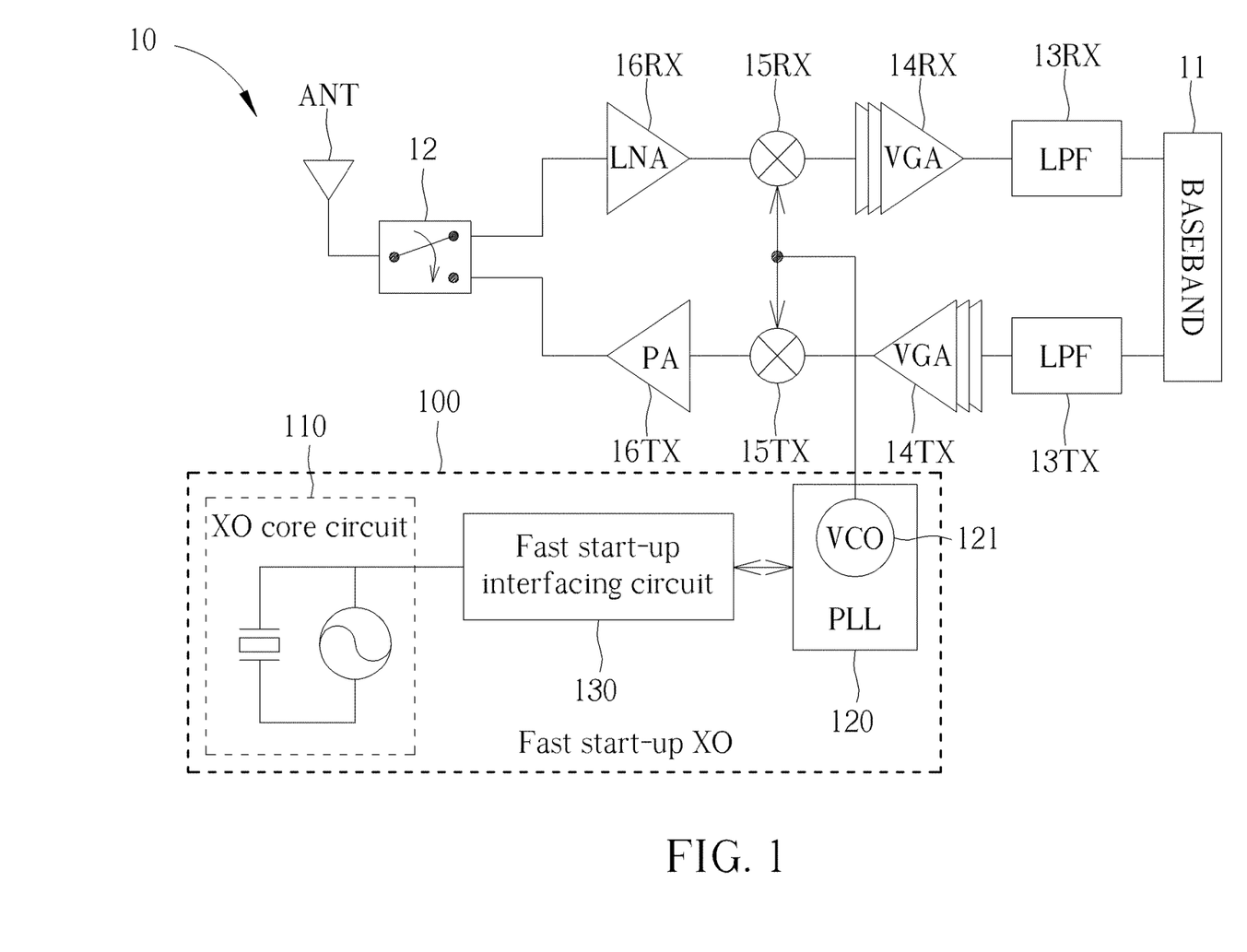
FIG. 1 is a diagram illustrating a radio frequency (RF) transceiver according to an embodiment of the present invention.

FIG. 1 is a diagram illustrating a radio frequency (RF) transceiver 10 according to an embodiment of the present invention. As shown in FIG. 1, the RF transceiver 10 may comprise a baseband circuit 11 (labeled "BASEBAND" in FIG. 1 for brevity), a transmitter path, a receiver path, a single pole double throw (SPDT) switch circuit 12 and an antenna ANT. In particular, the transmitter path may comprise a low pass filter (LPF) 13TX, a variable gain amplifier (VGA) 14TX, a mixer 15TX and a power amplifier (PA) 16TX, and the receiver path may comprise the low noise amplifier (LNA) 16RX, a mixer 15RX, a VGA 14RX and a LPF 13RX. In addition, the RF transceiver 10 may further comprise a PLL 120, where a voltage control oscillator (VCO) 121 within the PLL 120 is coupled to the mixers 15TX and 15RX, in order to allow the mixers 15TX and 15RX to perform up-conversion and down conversion based on a clock output from the PLL 120, respectively. In this embodiment, a fast start-up crystal oscillator (XO) 100 may be adopted in the RF transceiver 10, where the fast start-up XO 100 may comprise the PLL 120, a XO core circuit 110 and a fast start-up interfacing circuit 130.

Figure 2:
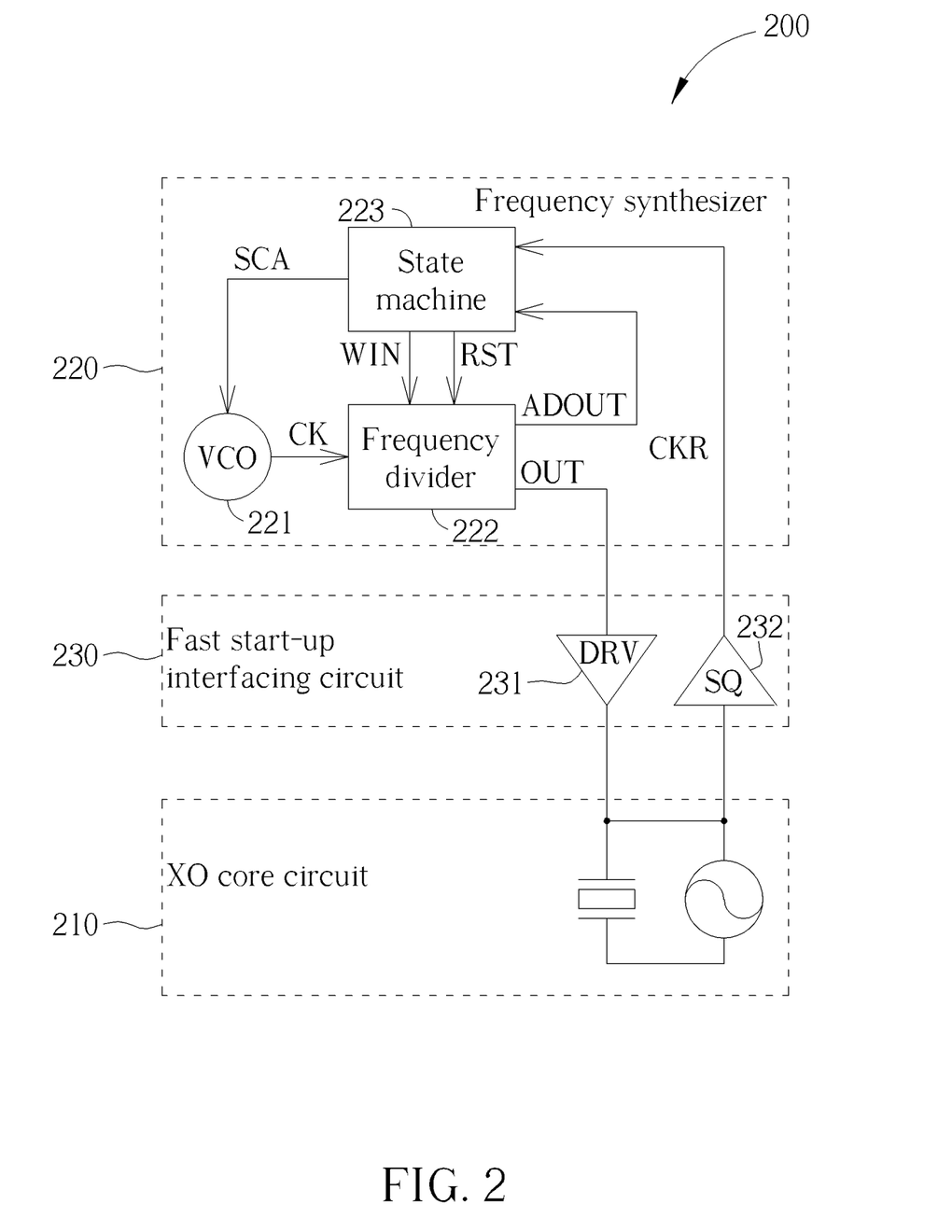
FIG. 2 is a diagram illustrating a fast start-up crystal oscillator (XO) according to an embodiment of the present invention.

FIG. 2 is a diagram illustrating a fast start-up XO 200 according to an embodiment of the present invention, where the fast start-up XO 200 may be an example of the fast start-up XO 100 shown in FIG. 1. As shown in FIG. 2, the fast start-up XO 200 may comprise a XO core circuit 210, a frequency synthesizer 220, and a fast start-up interfacing circuit 230 coupled between the XO core circuit 210 and the frequency synthesizer 220. More particularly, the frequency synthesizer 220 may comprise a VCO 221, a divider such as a frequency divider 222 coupled to the VCO 221, and a controller such as a state machine 223 coupled to the VCO 221 and the frequency divider 222. The fast start-up interfacing circuit 230 may comprise a driver 231 (labeled "DRV" in figures for brevity) coupled between the XO core circuit 210 and the frequency divider 222, and further comprise a rectangular wave generator such as a square wave generator 232 (labeled "SQ" in figures for brevity) coupled between the XO core circuit 210 and the state machine 223.

In this embodiment, the XO core circuit 210 is configured to generate a XO signal (e.g., a sinusoidal wave) having a XO frequency. The VCO 221 is configured to generate a VCO clock CK having a VCO frequency. The frequency divider 222 is configured to generate a divided clock OUT having a divided frequency, wherein the VCO frequency is divided by a divisor of the frequency divider 222 to obtain the divided frequency. The fast start-up interfacing circuit 230 is configured to transmit the divided clock OUT to the XO core circuit 210, and then generate a reference clock CKR having the XO frequency according to the XO signal. More particularly, the driver 231 is configured to inject energy into the XO signal by transmitting the divided clock OUT to the XO core circuit, and the square wave generator 232 is configured to generate the reference clock CKR by converting the XO signal into a rectangular wave such as a square wave, wherein the rectangular wave may represent the reference clock CKR. Based on the above operations, the VCO frequency can be calibrated according to the reference clock CKR, in order to make the divided frequency approach the XO frequency. For example, a frequency difference between the divided frequency and the XO frequency may be calibrated to be less than a target value such as 500 parts per million (ppm), and thereby ensures that a fast start-up procedure of the fast start-up XO 200 can effectively improve start-up speed under a certain range of frequency drifting due to temperature variation (e.g., −40° C. to 125° C.).

Figure 3:
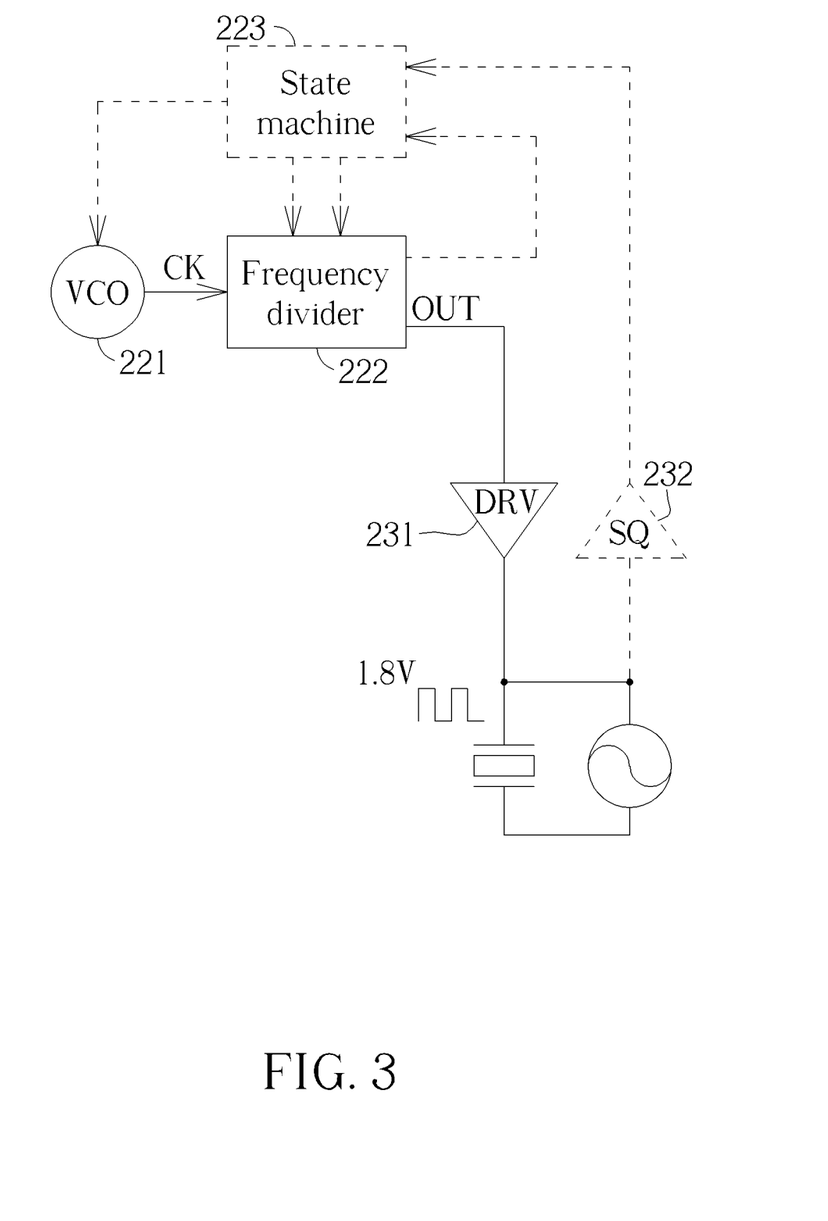
FIG. 3 is a diagram illustrating a first configuration of the fast start-up XO shown in FIG. 2.
Figure 4:
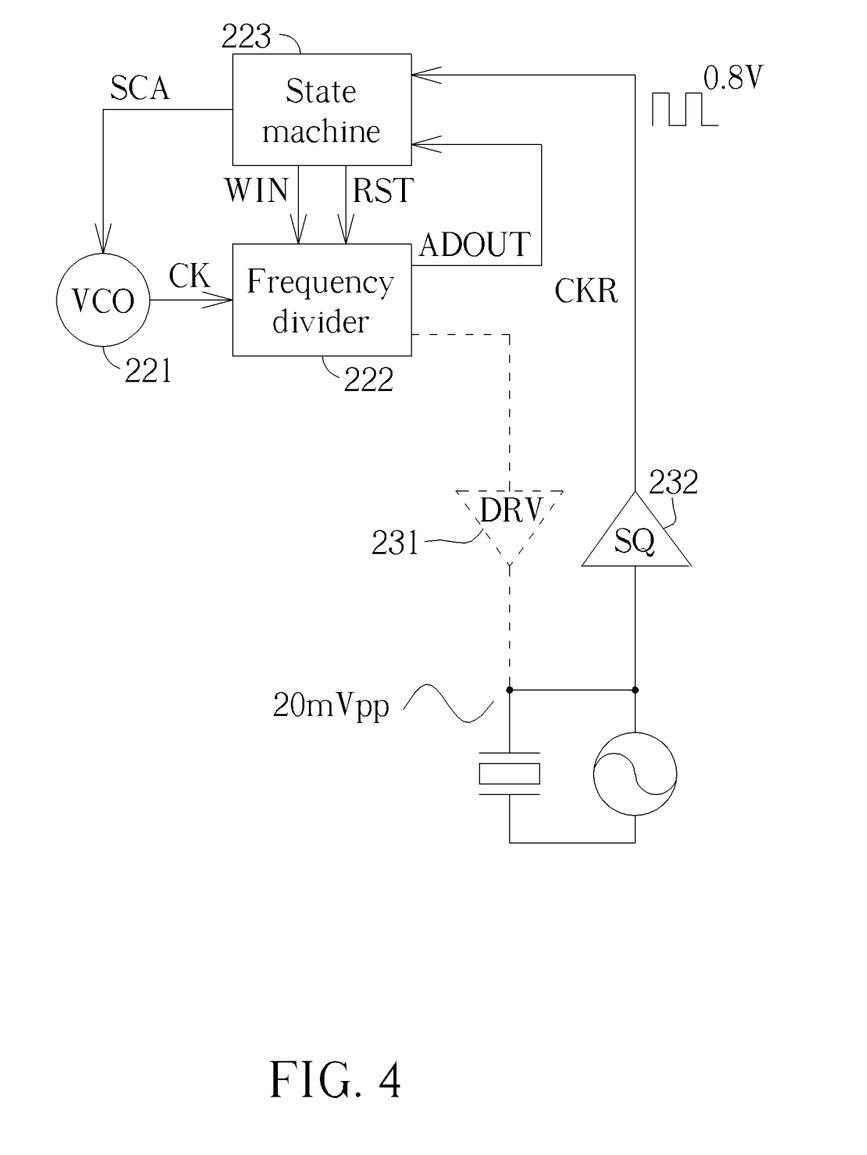
FIG. 4 is a diagram illustrating a second configuration of the fast start-up XO shown in FIG. 2.

At the beginning of the fast start-up procedure, energy of the XO signal generated by the XO core circuit 210 is quite small. During a first driving phase of the fast start-up procedure, the driver 231 may be enabled and the square wave generator 232 may be disabled, in order to increase the energy of the XO signal, where enabled components and related signals thereof are depicted in solid lines, and disabled components and related signals thereof are depicted in dashed lines, as shown in FIG. 3. In this embodiment, the state machine 223 may be disabled in the first driving phase, but the present invention is not limited thereto. Furthermore, the driver 231 may have a function of level shifting, which shifts the divided clock OUT from a first voltage domain into a second voltage domain, but the present invention is not limited thereto. For example, the frequency synthesizer 220 (e.g., the frequency divider 222 therein) may operate under a supply voltage of 0.8 volts (V), and therefore the divided clock OUT may be a rectangular wave varying between 0 V and 0.8 V, where the driver 231 may convert the divided clock OUT into a rectangular wave varying between 0 V and 1.8 V. During a frequency calibration (FCAL) phase of the fast start-up procedure later than the first driving phase, the driver 231 may be disabled and the square wave generator 232 may be enabled, in order to calibrate the VCO frequency, where enabled components and related signals thereof are depicted in solid lines, and disabled components and related signals thereof are depicted in dashed lines, as shown in FIG. 4. For example, the square wave generator 232 may convert the XO signal such as a 20 milli volt peak-to-peak (mVpp) sinusoidal wave into the reference clock CKR such as a rectangular wave varying between 0 V and 0.8 V, and the state machine 223 may receive the reference clock CKR to control operations related to the calibration. During a second driving phase of the fast start-up procedure later than the FCAL phase, the driver 231 may be enabled and the square wave generator 232 may be disabled as shown in FIG. 3, in order to proceed to increase the energy of the XO signal by the divided clock OUT having the divided frequency which has been calibrated. As the divided frequency can be close to the XO frequency (e.g., having a frequency difference less than 500 ppm between the divided frequency and the XO frequency) after the FCAL phase, increasing speed of the energy of the XO signal in the second driving phase can be much faster than that in the first driving phase.

It should be noted that the divided frequency may be slightly different from the XO frequency after FCAL in practice. More particularly, if a phase difference between the divided clock OUT and the XO signal accumulates and therefore reaches a certain value, the energy of the XO signal will be decreasing, and thereby slows down the start-up speed. In view of the above, during a first synchronization phase of the fast start-up procedure before the second driving phase and later than the FCAL phase, the driver 231 may be disabled and the square wave generator 232 may be enabled as shown in FIG. 4, and the frequency divider 222 may be reset according to the reference clock CKR (e.g., be reset by a reset signal RST generated according to the reference clock CKR), in order to synchronize a phase of the divided clock OUT with a phase of the XO signal, which ensures that the energy of the XO signal is always increasing.

In addition, operations of the second driving phase and the first synchronization phase may be performed for multiple times. For example, during a second synchronization phase of the fast start-up procedure later than the second driving phase, the driver 231 may be disabled and the square wave generator 232 may be enabled, and the frequency divider 222 may be reset according to the reference clock CKR, in order to synchronize the phase of the divided clock with the phase of the XO signal again. During a third driving phase of the fast start-up procedure later than the second synchronization phase, the driver 231 may be enabled and the square wave generator 232 may be disabled, in order to proceed to increase the energy of the XO signal by the divided clock OUT.

In particular, during the FCAL phase, the state machine 223 shown in FIG. 2 is configured to control the VCO frequency via a control signal SCA (e.g., control at least one variable capacitor or at least one resistor within the VCO 221 via the control signal SCA) according to a counting result ADOUT from the frequency divider 222, and the counting result ADOUT may indicate whether a count of cycles of the VCO clock CK within a counting period (e.g., a period specified by a window signal WIN output from the state machine 223) reaches a target value or not. In addition, the target value is determined according to a target frequency which is equal to N times the XO frequency, and N may represent a value of the divisor of the divider. For example, Fxo may represent the XO frequency, where the VCO frequency of the VCO clock CK is calibrated to approach N×Fxo, and the target value is determined by calculating a count of cycles of a clock having a frequency equal to N×Fxo. Thus, when the counting result ADOUT indicates that the count of cycles of the VCO clock CK reaches the target value (which means the VCO 221 is too fast), the state machine 223 may decrease the VCO frequency; and when the counting result ADOUT indicates that the count of cycles of the VCO clock CK does not reach the target value (which means the VCO 221 is too slow), the state machine 223 may increase the VCO frequency.

Figure 5:
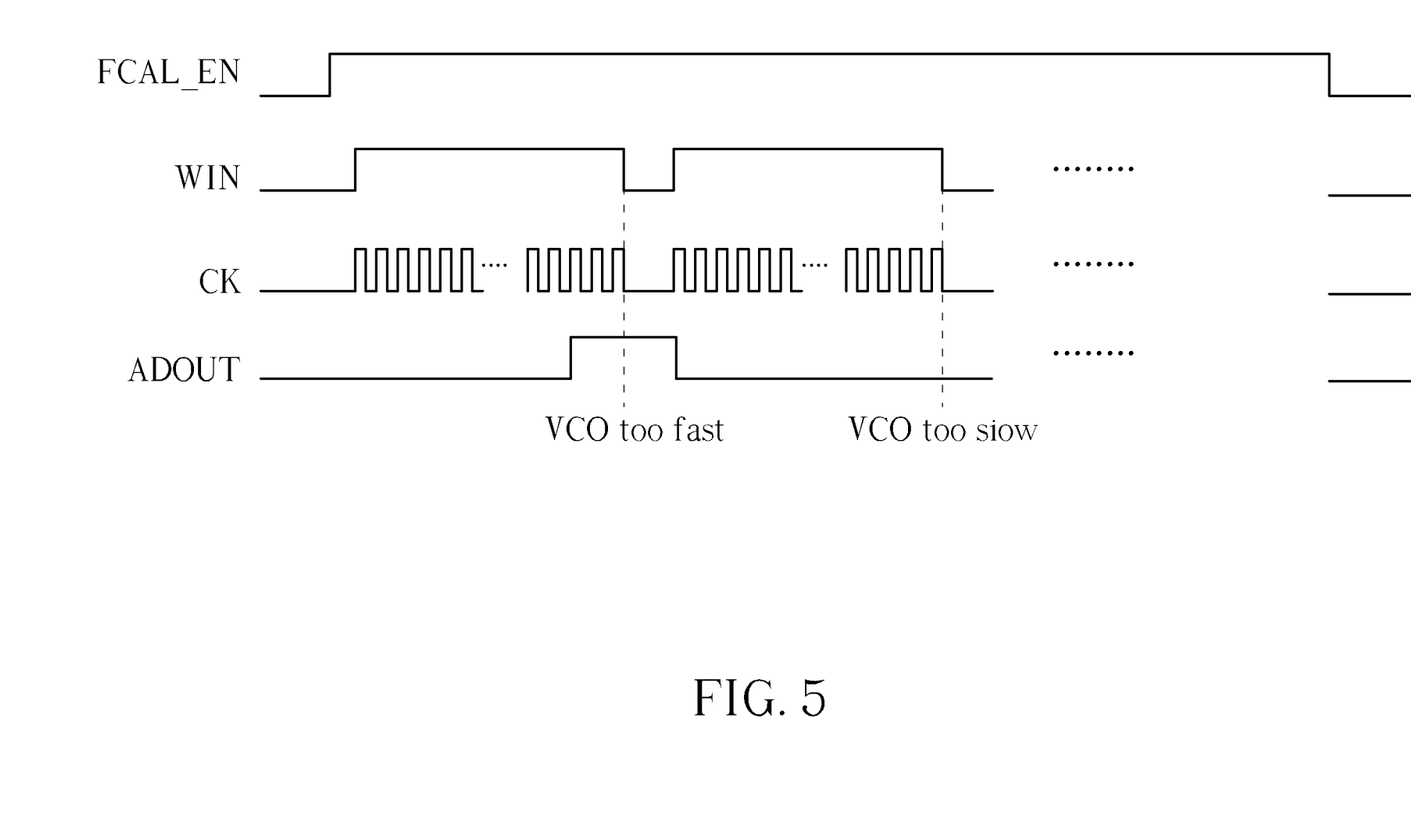
FIG. 5 is a diagram illustrating some signals related to frequency calibration (FCAL) according to an embodiment of the present invention.

FIG. 5 is a diagram illustrating some signals (e.g., FCAL_EN, WIN, CK and ADOUT) related to FCAL of the VCO clock CK according to an embodiment of the present invention. When the control signal FCAL_EN is pulled from low (e.g., a level representing a logic value "0") to high (e.g., a level representing a logic value "1"), FCAL of the VCO clock may be enabled. Those skilled in this art should understand that the frequency divider 222 may be configured as a counter by gating some internal signals of the frequency divider 222, and related details are omitted here for brevity. When the window signal WIN is pulled from low to high, the frequency divider 222 may start counting cycles of the VCO clock CK, and when the count of cycles of the VCO clock CK reaches the target value, the counting result ADOUT may be pulled from low to high. At the moment of the window signal WIN being pulled from high to low, the counting result may be transmitted to the state machine 223, if a logic state of the counting result ADOUT at this moment is high (which means the VCO 221 is too fast), the state machine 223 may utilize the control signal SCA to decrease the VCO frequency, and if the logic state of the counting result ADOUT at this moment is low (which means the VCO 221 is too slow), the state machine 223 may utilize the control signal SCA to increase the VCO frequency.

Figure 6:
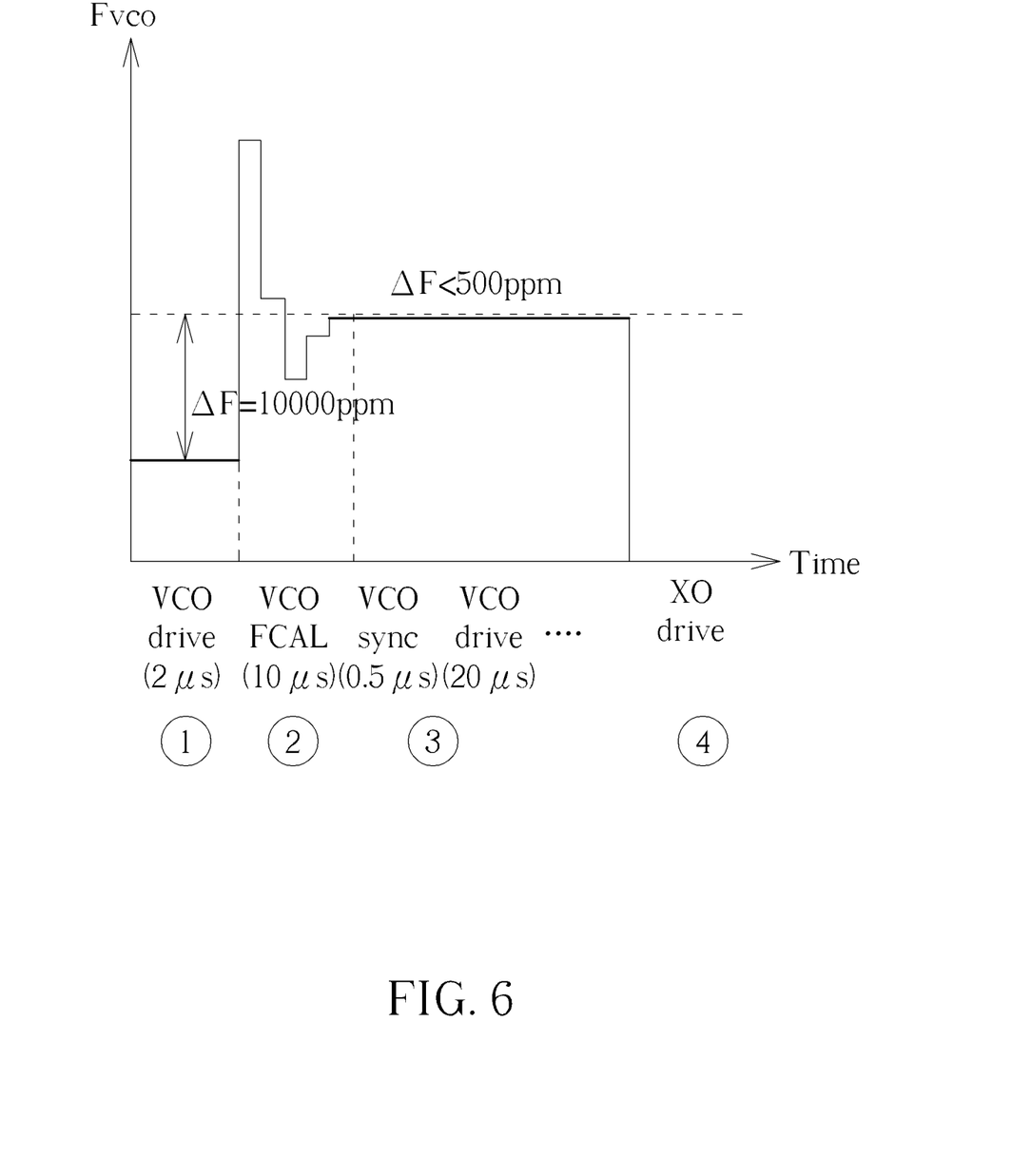
FIG. 6 is a diagram illustrating some details of FCAL according to an embodiment of the present invention.

FIG. 6 is a diagram illustrating some details of FCAL of the VCO frequency (e.g., Fvco) according to an embodiment of the present invention. During a first phase (labeled a circle with "1" numbered therein), which may be an example of the aforementioned first driving phase and is labeled "VCO drive" for better comprehension, a frequency difference ΔF between the VCO frequency Fvco and the target frequency (e.g., N×Fxo) may be large (e.g., ΔF=10000 ppm) due to temperature variation, where the target frequency is depicted as a horizontal dashed line in FIG. 6 for better comprehension. In this embodiment, the time period of the first phase may be 2 micro seconds (μs) when N×Fxo=4800 Mega Hertz (MHz), but the present invention is not limited thereto. During a second phase (labeled a circle with "2" numbered therein), which may be an example of the aforementioned FCAL phase and is labeled "VCO FCAL" for better comprehension, the frequency difference ΔF is calibrated to be less than a certain value which is acceptable (e.g., ΔF<500 ppm). In this embodiment, the VCO frequency Fvco is calibrated to approach the target frequency with aid of a binary search algorithm as shown in FIG. 6, but the present invention is not limited thereto. Under a condition where the binary search algorithm is utilized and N×Fxo=4800 MHz, the time period of the second phase may be at least 6.5 μs and is set to be 10 μs in this embodiment, which is sufficient for calibrating a frequency difference of 10000 ppm to be less than 500 ppm, but the present invention is not limited thereto. During a third phase (labeled a circle with "3" numbered therein), which may be an example of combination of the first synchronization phase and the second driving phase and are respectively labeled "XO sync" and "VCO drive" for better comprehension, operations of resetting the frequency divider 222 and driving the XO core circuit 210 are repeatedly performed, in order to keep increasing the energy or swing of the XO signal. In this embodiment, each time period of resetting the frequency divider 222 is set to be 0.5 μs and each time period of driving the XO core circuit 210 is set to be 20 μs during the third phase, but the present invention is not limited thereto. During a fourth phase (labeled a circle with "4" numbered therein), as the energy or swing of the XO signal is large enough to allow the XO core circuit 210 to oscillate by its own, the fast start-up interfacing circuit 230 may be disabled, and the XO core circuit is able to provide a precise reference clock for further usage (labeled "XO drive" for better comprehension).

It should be noted that each time period mentioned above is for illustrative purposes only, and is not meant to be a limitation of the present invention. For example, this embodiment utilizes a 5-bit calibration code to calibrate the VCO frequency Fvco, but the number of bits of this digital code may vary in response to a difference target resolution of the FCAL. A finer resolution of FCAL (which correspond to a smaller frequency difference ΔF after FCAL) can allow the time period of driving the XO core circuit 210 (e.g., the time period of the second driving phase) to be longer, and the number of times of synchronization (e.g., the number of times of resetting the frequency divider 222) can be reduced. For a purpose of calibrating the frequency difference ΔF to a smaller value, the number of bits of a calibration code may be increased, and the width of the window signal WIN shown in FIG. 5 may be increased (e.g., utilizing a longer time for counting the number of cycles of the VCO clock CK), which may result in a longer time period of the FCAL phase. Based on the above description, those skilled in this art should understand how to determine time periods of the phases mentioned above such as the first driving phase, the FCAL phase, the second driving phase, etc. and related details are omitted here for brevity.

Figure 7:
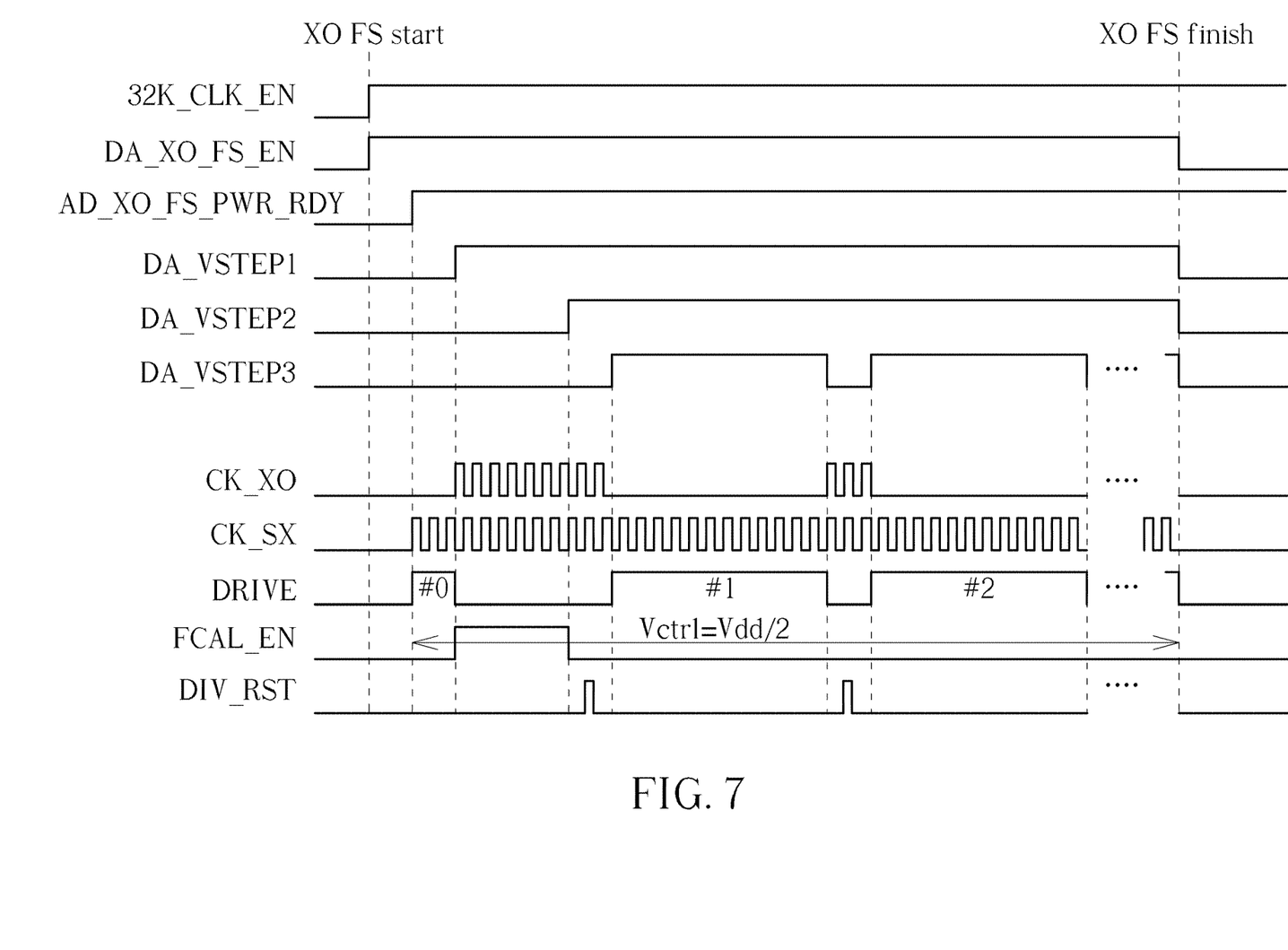
FIG. 7 is a diagram illustrating overall timing of a fast start-up procedure according to an embodiment of the present invention.

FIG. 7 is a diagram illustrating overall timing of the fast start-up procedure according to an embodiment of the present invention. For example, the transceiver 10 shown in FIG. 1 may comprise a timing controller (not shown) which is configured to generate control signals 32K_CLK_EN, DA_XO_FS_EN, AD_XO_FS_PWR_RDY, DA_VSTEP1, DA_VSTEP2, DA_VSTEP3, CK_XO, CK_SX, DRIVE, and FCAL_EN and DIV_RST, in order to control operations of the fast start-up procedure, where the clocks CK_XO and CK_SX may be examples of the reference clock CKR and the divided clock OUT, respectively, and the control signal DIV_RST may be an example of the reset signal RST. When the control signal 32K_CLK_EN is pulled from low to high, some settings may be loaded into this timing controller and/or the state machine 223 for a XO fast start-up scenario, the control signal DA_XO_FS_EN may be pulled from low to high for enabling the fast start-up procedure, and the fast start-up procedure starts (labeled "XO FS start" in FIG. 7). The control signal AD_XO_FS_PWR_RDY may be pulled from low to high when a XO low dropout regulator (LDO) is ready, and the fast start-up procedure proceeds with the first driving phase (e.g., a period labeled "#0" on the control signal DRIVE). When the control signal DA_VSTEP1 is pulled from low to high, the fast start-up procedure proceeds with the FCAL phase, and the control signal FCAL_EN is pulled from low to high for enabling the FCAL of the VCO 221. After the FCAL is done, the control signal DA_VSTEP2 may be pulled from low to high, and the fast start-up procedure proceeds with the first synchronization phase, where the state machine 223 may transmit a high logic state of the control signal DIV_RST to the frequency divider 222 in order to perform synchronization. When the control signal DA_VSTEP3 is pulled from low to high, the fast start-up procedure proceeds with the second driving phase (e.g., a period labeled "#1" on the control signal DRIVE). When the control signal DA_VSTEP3 is pulled from high to low, it is determined that the driving phase #1 is over and the operations of synchronization and VCO driving (e.g., as illustrated by a period labeled "#2" on the control signal DRIVE) may be performed again. When the swing of the XO signal grows to an acceptable level (e.g., higher than a predetermined threshold), the control signals DA_XO_FS_EN and the all the XO fast start-up related signals (DA_STEP1, DA_STEP2, DA_STEP3, CK_SX, DRIVE, FCAL_EN and DIV_RST) may be pulled low no matter what previous state is, and the fast start-up procedure ends (labeled "XO FS finish" in FIG. 7). The frequency synthesizer 220 is turned off after DA_XO_FS_EN is pulled low for power saving (as illustrated by the clock CK_SX, which is inactive after DA_XO_FS_EN is pulled low). In this embodiment, a control voltage Vctrl of the VCO 221 may be fixed at a predetermined voltage such as a half of a supply voltage Vdd of the frequency synthesizer 220 during the whole fast start-up procedure (labeled "Vctrl=Vdd/2" in FIG. 7), but the present invention is not limited thereto.

In some embodiment, when the RF transceiver 10 operates in a listen mode, the XO core circuit 210 may be configured to receive control signals (e.g. top digital control signals) from a top digital circuit 81 (e.g. a top digital control circuit), and the frequency synthesizer 220 may be configured to receive control signals (e.g. RF digital control signals) from a RF digital circuit 82 (e.g. a RF digital control circuit). It should be noted that the top digital circuit 81 is always enabled as long as an electronic device equipped with the RF transceiver 10 is powered on, but the RF digital circuit 82 may be disabled when the RF transceiver 10 enters a sleep mode (e.g., the XO core circuit is disabled). In some embodiment, the RF digital circuit 82 is enabled after the start-up procedure is completed. In order to ensure that the frequency synthesizer 220 can receive control signals during the fast start-up procedure, modification on control management mentioned above is required.

Figure 8:
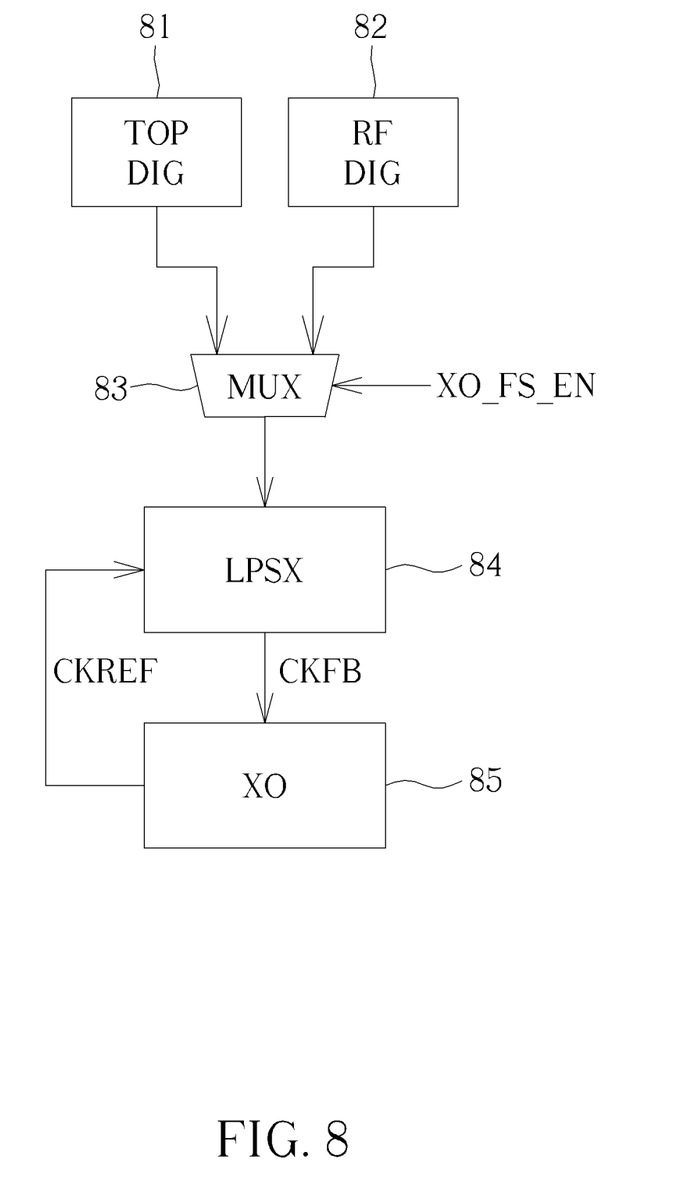
FIG. 8 is a diagram illustrating a first digital control scheme according to an embodiment of the present invention.

FIG. 8 is a diagram illustrating a first digital control scheme according to an embodiment of the present invention. In this embodiment, a multiplexer (MUX) 83 is coupled to the frequency synthesizer 220 such as a low power synthesizer (LPSX) 84 shown in FIG. 8. In this embodiment, the XO core circuit 210 and the fast start-up interfacing circuit 230 may be collectively referred to as a XO 85 shown in FIG. 8, where a feedback clock CKFB may represent the divided clock OUT shown in FIG. 2, and a reference clock CKREF may represent the reference clock CKR shown in FIG. 2. In this embodiment, the top digital circuit 81 (labeled "TOP DIG" in figured for brevity) is always enabled, and the RF digital circuit 82 (labeled "RF DIG" in figured for brevity) is enabled after the fast start-up procedure is completed. Based on this configuration, when a logic value of a control signal XO_FS_EN is "1", the fast start-up procedure is enabled (the RF digital circuit 82 is not enabled yet), and the MUX 83 may select the top digital circuit 81 for providing control signals to the LPSX 84; and when the logic value of the control signal XO_FS_EN is "0", the fast start-up procedure is completed and then disabled (the RF digital circuit 82 is enabled), and the MUX 83 may select the RF digital circuit 82 for providing control signals to the LPSX 84; but the present invention is not limited thereto.

Figure 9:
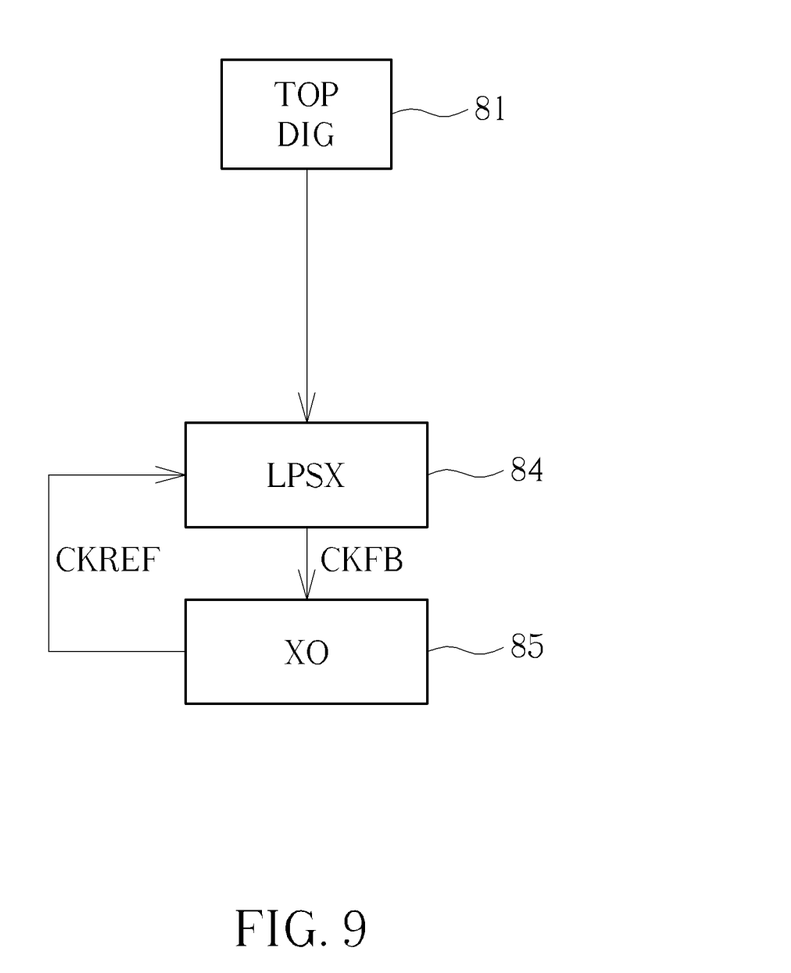
FIG. 9 is a diagram illustrating a third digital control scheme according to an embodiment of the present invention.

FIG. 9 is a diagram illustrating a second digital control scheme according to an embodiment of the present invention. In this embodiment, the RF digital circuit 82 is omitted, and the LPSX 84 is always configured to receive control signals from the top digital circuit 81 which is always enabled, but the present invention is not limited thereto.

Figure 10:
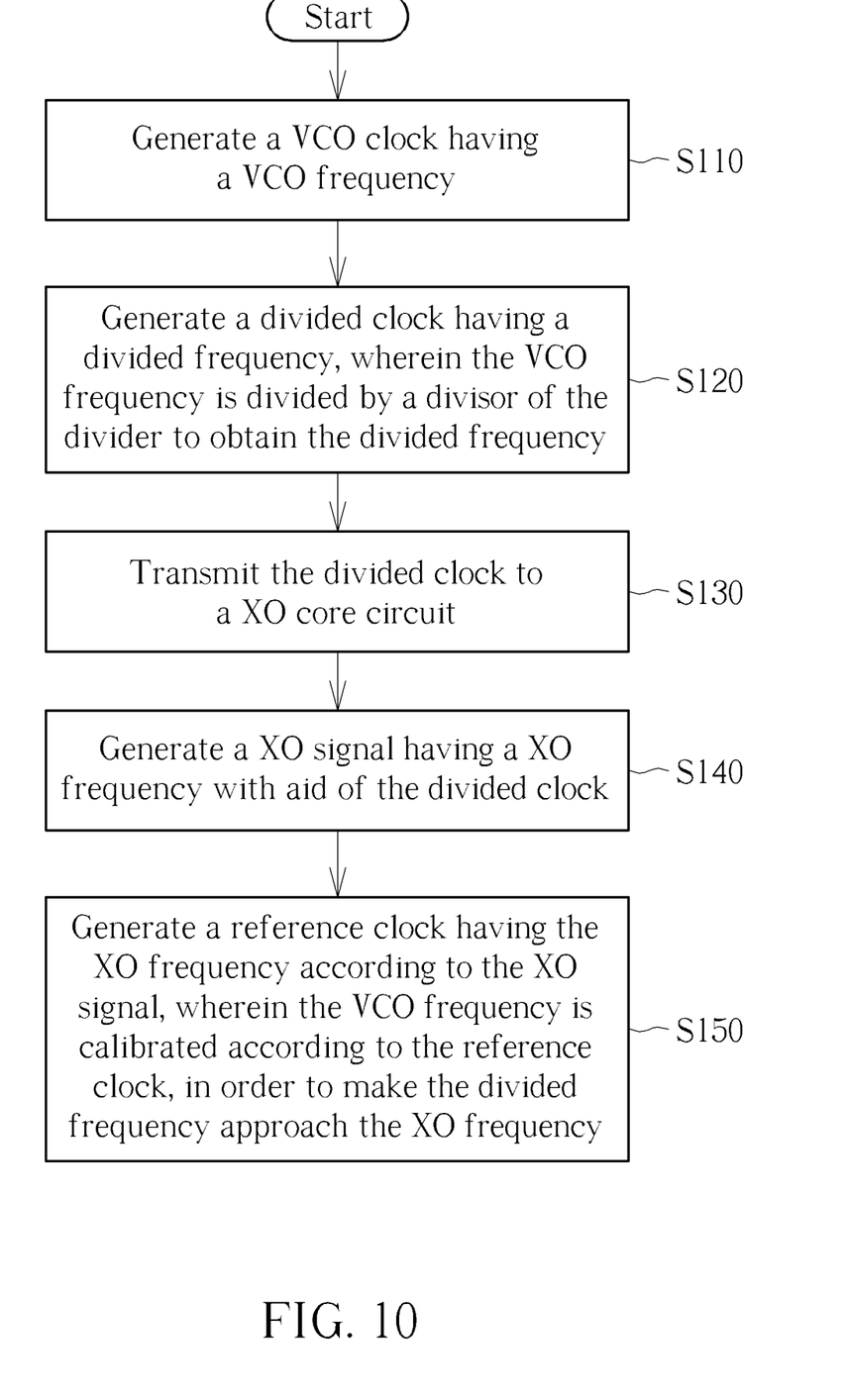
FIG. 10 is a diagram illustrating a working flow of a fast start-up method of a XO according to an embodiment of the present invention.

FIG. 10 is a diagram illustrating a working flow of a fast start-up method of a XO (e.g., the fast start-up XO 200 shown in FIG. 2) according to an embodiment of the present invention. It should be noted that the working flow shown in FIG. 10 is for illustrative purposes only, and is not meant to be a limitation of the present invention. In some embodiments, one or more steps may be added, deleted or modified in the working flow shown in FIG. 10. In addition, if a same result may be obtained, these steps do not have to be executed in the exact order shown in FIG. 10.

In Step S110, a VCO (e.g., the VCO 221) may generate a VCO clock having a VCO frequency.

In Step S120, a divider (e.g., a frequency divider 222) may generate a divided clock having a divided frequency, wherein the VCO frequency is divided by a divisor of the divider to obtain the divided frequency.

In Step S130, a fast start-up interfacing circuit (e.g., the driver 231 within the fast start-up interfacing circuit 230) may transmit the divided clock to a XO core circuit (e.g., the XO core circuit 210).

In Step S140, the XO core circuit (e.g., the XO core circuit 210) may generate a XO signal having a XO frequency with aid of the divided clock.

In Step S150, the fast start-up interfacing circuit (e.g., the square wave generator 232 within the fast start-up interfacing circuit 230) may generate a reference clock having the XO frequency according to the XO signal, wherein the VCO frequency is calibrated according to the reference clock, in order to make the divided frequency approach the XO frequency.

Figure 11:
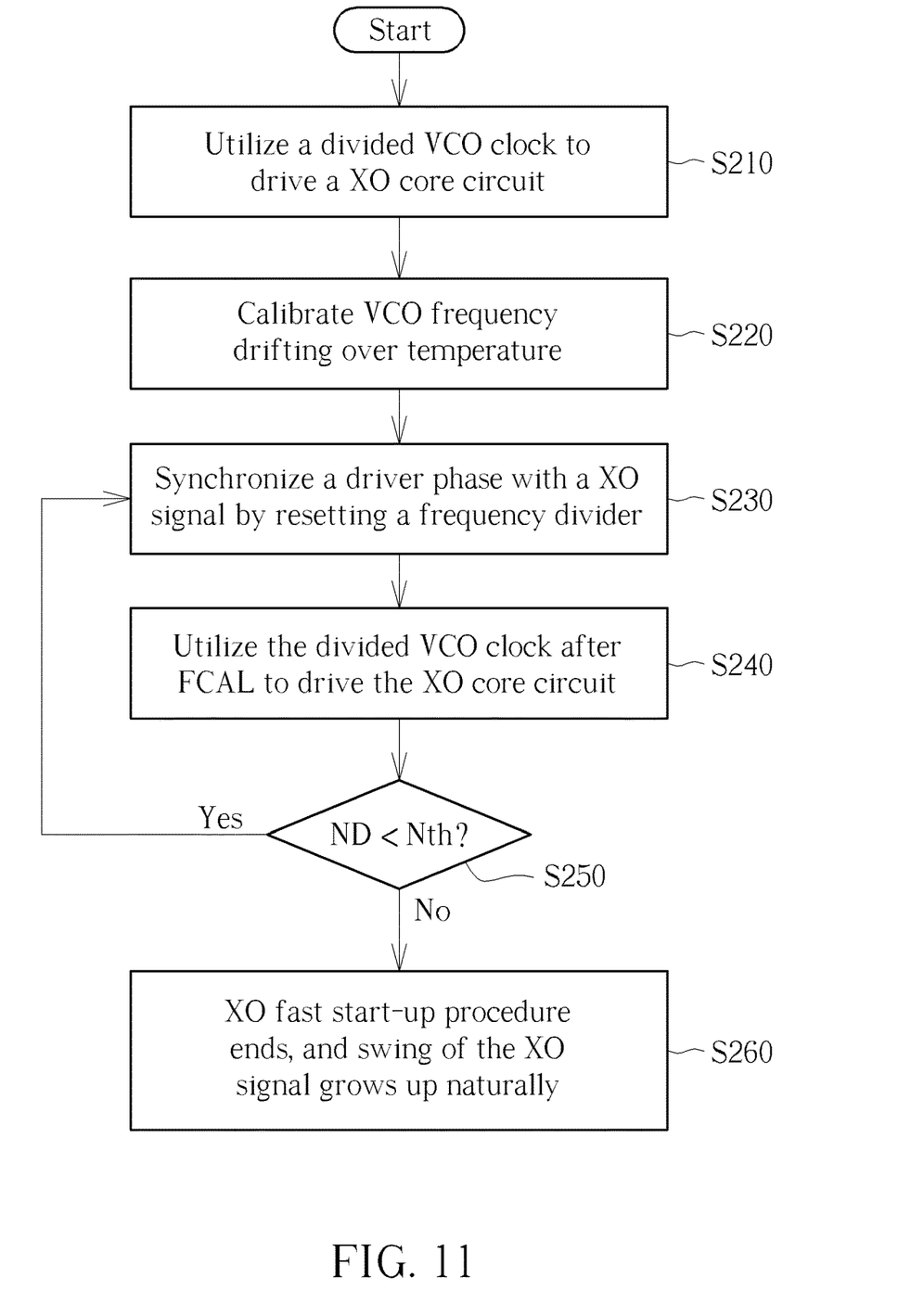
FIG. 11 is a diagram illustrating an example of the fast start-up method shown in FIG. 11.

FIG. 11 is a diagram illustrating an example of the fast start-up method shown in FIG. 10. It should be noted that the working flow shown in FIG. 11 is for illustrative purposes only, and is not meant to be a limitation of the present invention. In some embodiments, one or more steps may be added, deleted or modified in the working flow shown in FIG. 11. In addition, if a same result may be obtained, these steps do not have to be executed in the exact order shown in FIG. 11. In this embodiment, a parameter ND may be configured to indicate how many times a driving operation is performed, and the parameter ND is set to be zero at the beginning of a XO fast start-up procedure, but the present invention is not limited thereto.

In Step S210, a divided VCO clock (e.g., the divided clock OUT) is utilized to drive a XO core circuit (e.g., the XO core circuit 210).

In Step S220, VCO frequency drifting (e.g., frequency drifting of the VCO clock due to temperature variation) is calibrated over temperature.

In Step S230, a driver phase (e.g., the phase of the divided clock OUT which is utilized to drive the XO core circuit 210) is synchronized with a XO signal by resetting a frequency divider (e.g., the frequency divider 222).

In Step S240, the divided VCO clock (e.g., the divided clock OUT) after FCAL is utilized to drive the XO core circuit (e.g., the XO core circuit 210).

In Step S250, the parameter ND is increased by one, and a controller (e.g., the timing controller mentioned in the embodiment of FIG. 7 or the state machine 223) determines whether the parameter ND is less than a predetermined threshold Nth (labeled "ND++; ND<Nth?"). If the determination result is "Yes", the working flow proceeds with Step S230; and if the determination result is "No", the working flow proceeds with Step S260. It should be noted that the predetermined threshold Nth (which may be regarded as the predetermined number of times of running a loop comprising Steps S230 and S240) may be programmable, and is not limited to any specific value.

In Step S260, the XO fast start-up procedure ends, and swing of the XO signal grows up naturally.

It should be noted that FCAL of the present invention is performed upon the VCO frequency, in order to make the divided frequency approach the XO frequency. The VCO frequency may be a frequency over Giga Hertz (GHz) level, and therefore the VCO is preferably to be implemented by an inductor-capacitor (LC) oscillator, which is less sensitive to temperature variation. In addition, the operation of FCAL is performed at a high frequency such as the VCO frequency, rather than a low frequency such as the XO frequency. In comparison with performing calibration at the XO frequency, the present invention can greatly shorten time of FCAL, which is able to be performed during every wakeup without greatly consuming time. Even though other types of oscillator such as ring oscillators and resistor-capacitor (RC) oscillators may be more sensitive to temperature than the LC oscillator, frequency drifting due to temperature variation can be calibrated to be under an acceptable level without greatly increase cost (e.g., calibration time, hardware area).

To summarize, the fast start-up XO and the fast start-up method provided by the embodiments of the present invention can calibrate the frequency of the signal injected into the XO core circuit under a higher operating frequency (e.g., the VCO frequency), thereby greatly shorten the required time for FCAL. In addition, as a VCO within current transceivers usually operates under a frequency over GHz level, which is able to be implemented by a LC oscillator with acceptable component sizes, thereby further reducing sensitivity to temperature. In addition, no trimming regarding temperature is needed in the embodiments of the present invention. In comparison with the related art, the embodiments of the present invention can be improve robustness of a start-up procedure of a fast start-up XO regarding temperature variation without greatly increase overall costs (e.g., circuit area, power, calibration time, testing time). Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A crystal oscillator (XO), comprising:
   a XO core circuit, configured to generate a XO signal having a XO frequency;
   a frequency synthesizer, comprising:
      a voltage control oscillator (VCO), configured to generate a VCO clock having a VCO frequency; and
      a divider, coupled to the VCO, configured to generate a divided clock having a divided frequency, wherein the VCO frequency is divided by a divisor of the divider to obtain the divided frequency; and
   an interfacing circuit, coupled between the XO core circuit and the frequency synthesizer, configured to transmit the divided clock to the XO core circuit, and generate a reference clock having the XO frequency according to the XO signal, wherein the VCO frequency is calibrated according to the reference clock;
   wherein the interfacing circuit comprises:
      a driver, configured to inject energy into the XO signal by transmitting the divided clock to the XO core circuit; and
      a rectangular wave generator, configured to generate the reference clock by converting the XO signal into a rectangular wave, wherein the rectangular wave represents the reference clock.

2. The XO of claim 1, wherein:
   during a first driving phase, the driver is enabled and the rectangular wave generator is disabled, in order to increase energy of the XO signal;
   during a frequency calibration (FCAL) phase later than the first driving phase, the driver is disabled and the rectangular wave generator is enabled, in order to calibrate the VCO frequency; and
   during a second driving phase later than the FCAL phase, the driver is enabled and the rectangular wave generator is disabled, in order to proceed to increase the energy of the XO signal by the divided clock having the divided frequency which has been calibrated.

3. The XO of claim 2, wherein:
   during a first synchronization phase before the second driving phase and later than the FCAL phase, the driver is disabled and the rectangular wave generator is enabled, and the divider is reset according to the reference clock, in order to synchronize a phase of the divided clock with a phase of the XO signal.

4. The XO of claim 3, wherein:
   during a second synchronization phase later than the second driving phase, the driver is disabled and the rectangular wave generator is enabled, and the divider is reset according to the reference clock, in order to synchronize the phase of the divided clock with the phase of the XO signal; and during a third driving phase later than the second synchronization phase, the driver is enabled and the rectangular wave generator is disabled, in order to proceed to increase the energy of the XO signal by the divided clock.

5. A crystal oscillator (XO), comprising:
a XO core circuit, configured to generate a XO signal having a XO frequency;
a frequency synthesizer, comprising:
   a voltage control oscillator (VCO), configured to generate a VCO clock having a VCO frequency; and
   a divider, coupled to the VCO, configured to generate a divided clock having a divided frequency, wherein the VCO frequency is divided by a divisor of the divider to obtain the divided frequency; and
an interfacing circuit, coupled between the XO core circuit and the frequency synthesizer, configured to transmit the divided clock to the XO core circuit, and generate a reference clock having the XO frequency according to the XO signal, wherein the VCO frequency is calibrated according to the reference clock;
wherein the frequency synthesizer further comprises:
   a controller, coupled to the VCO and the divider, configured to control the VCO frequency according to a counting result from the divider, and the counting result indicates whether a count of cycles of the VCO clock within a counting period reaches a target value or not.

6. The XO of claim 5, wherein the target value is determined according to a target frequency which is substantially equal to N times the XO frequency, and N represents a value of the divisor of the divider.

7. The XO of claim 5, wherein when the counting result indicates that the count of cycles of the VCO clock reaches the target value, the controller decreases the VCO frequency; and when the counting result indicates that the count of cycles of the VCO clock does not reach the target value, the controller increase the VCO frequency.

8. A start-up method of a crystal oscillator (XO), comprising:
utilizing a voltage control oscillator (VCO) to generate a VCO clock having a VCO frequency;
utilizing a divider to generate a divided clock having a divided frequency, wherein the VCO frequency is divided by a divisor of the divider to obtain the divided frequency; and
utilizing an interfacing circuit to transmit the divided clock to a XO core circuit;
utilizing the XO core circuit to generate a XO signal having a XO frequency with aid of the divided clock; and
utilizing the interfacing circuit to generate a reference clock having the XO frequency according to the XO signal, wherein the VCO frequency is calibrated according to the reference clock;
wherein utilizing the interfacing circuit to transmit the divided clock to the XO core circuit comprises utilizing a driver of the interfacing circuit to inject energy into the XO signal by transmitting the divided clock to the XO core circuit; and utilizing the interfacing circuit to generate the reference clock having the XO frequency according to the XO signal comprises utilizing a rectangular wave generator of the interfacing circuit to generate the reference clock by converting the XO signal into a rectangular wave, wherein the rectangular wave represents the reference clock.

9. The start-up method of claim 8, wherein:
during a first driving phase, the driver is enabled and the rectangular wave generator is disabled, in order to increase energy of the XO signal;
during a frequency calibration (FCAL) phase later than the first driving phase, the driver is disabled and the rectangular wave generator is enabled, in order to calibrate the VCO frequency; and
during a second driving phase later than the FCAL phase, the driver is enabled and the rectangular wave generator is disabled, in order to proceed to increase the energy of the XO signal by the divided clock having the divided frequency which has been calibrated.

10. The start-up method of claim 9, wherein:
during a first synchronization phase before the second driving phase and later than the FCAL phase, the driver is disabled and the rectangular wave generator is enabled, and the divider is reset according to the reference clock, in order to synchronize a phase of the divided clock with a phase of the XO signal.

11. The start-up method of claim 10, wherein:
during a second synchronization phase later than the second driving phase, the driver is disabled and the rectangular wave generator is enabled, and the divider is reset according to the reference clock, in order to synchronize the phase of the divided clock with the phase of the XO signal; and
during a third driving phase later than the second synchronization phase, the driver is enabled and the rectangular wave generator is disabled, in order to proceed to increase the energy of the XO signal by the divided clock.

12. A start-up method of a crystal oscillator (XO), comprising:
utilizing a voltage control oscillator (VCO) to generate a VCO clock having a VCO frequency;
utilizing a divider to generate a divided clock having a divided frequency, wherein the VCO frequency is divided by a divisor of the divider to obtain the divided frequency; and
utilizing an interfacing circuit to transmit the divided clock to a XO core circuit;
utilizing the XO core circuit to generate a XO signal having a XO frequency with aid of the divided clock;
utilizing the interfacing circuit to generate a reference clock having the XO frequency according to the XO signal, wherein the VCO frequency is calibrated according to the reference clock; and
controlling the VCO frequency according to a counting result from the divider, wherein the counting result indicates whether a count of cycles of the VCO clock within a counting period reaches a target value or not.

13. The start-up method of claim 12, wherein the target value is determined according to a target frequency which is substantially equal to N times the XO frequency, and N represents a value of the divisor of the divider.

14. The fast start-up method of claim 12, wherein controlling the VCO frequency according to the counting result from the divider comprises:
when the counting result indicates that the count of cycles of the VCO clock reaches the target value, decreasing the VCO frequency; or when the counting result indicates that the count of cycles of the VCO clock does not reach the target value, increasing the VCO frequency.

* * * * *